United States Patent
Bucknor et al.

(10) Patent No.: US 7,593,706 B2
(45) Date of Patent: Sep. 22, 2009

(54) DYNAMIC PRE-SELECTOR FOR A GPS RECEIVER

(75) Inventors: Brian E. Bucknor, Miramar, FL (US); Humberto E. Garcia, Miami Lakes, FL (US); Roberto Gautier, Davie, FL (US)

(73) Assignee: Motorola, Inc., Schaumburg, IL (US)

( * ) Notice: Subject to any disclaimer, the term of this patent is extended or adjusted under 35 U.S.C. 154(b) by 812 days.

(21) Appl. No.: 11/313,571

(22) Filed: Dec. 21, 2005

(65) Prior Publication Data

US 2007/0142013 A1    Jun. 21, 2007

(51) Int. Cl.
*H04B 1/06* (2006.01)
*H04B 7/00* (2006.01)

(52) U.S. Cl. ............ 455/234.1; 455/296; 455/136; 342/357.12; 342/357.06

(58) Field of Classification Search ........... 455/283, 455/266, 552.1, 180.1, 188.1, 227, 63.1, 455/278.1, 307, 296, 82, 118, 562.1, 553.1, 455/132–141; 375/350, 316, 343, 346, 254, 375/349; 342/357.12, 357.06, 379, 357.01, 342/378–384, 361–367, 357.02

See application file for complete search history.

(56) References Cited

U.S. PATENT DOCUMENTS

| 4,457,006 | A | * | 6/1984 | Maine | 375/333 |
| 6,175,327 | B1 | * | 1/2001 | Lin et al. | 342/357.06 |
| 6,208,844 | B1 |   | 3/2001 | Abdelgany |  |
| 6,590,528 | B1 | * | 7/2003 | DeWulf | 342/357.12 |
| 6,771,214 | B2 |   | 8/2004 | Kober et al. |  |
| 6,842,498 | B2 |   | 1/2005 | Heinzl et al. |  |
| 7,221,312 | B2 | * | 5/2007 | Yee et al. | 342/357.02 |
| 2004/0071200 | A1 | * | 4/2004 | Betz et al. | 375/152 |
| 2005/0181752 | A1 |   | 8/2005 | Sahota |  |
| 2006/0209779 | A1 | * | 9/2006 | Rousu et al. | 370/343 |
| 2008/0297411 | A1 | * | 12/2008 | Kang | 342/357.12 |

FOREIGN PATENT DOCUMENTS

WO   WO 02/11470   2/2002
WO   WO 02/14889   2/2002

* cited by examiner

*Primary Examiner*—Sujatha Sharma

(57) ABSTRACT

A GPS receiver circuit (300) for reducing insertion loss. The receiver circuit (300) includes a switch (304) for diverting input signals between a filtered pathway (312) and a short circuit pathway (310) to an amplifier (314). The amplifier (314) output feeds an automatic gain controller (316) that senses a noise level in the output of the amplifier (314) and adjusts a gain of the amplifier (314) in response to the noise level. The receiver circuit (300) also includes a threshold detector (306) with an input coupled to the output of the automatic gain controller (316) and an output coupled to the switch (304) for selecting between the filtered pathway (312) and the short circuit pathway (310), thereby removing the filter (312) from the signal path if not needed.

20 Claims, 4 Drawing Sheets

DYNAMIC PRE-SELECTOR FOR A GPS RECEIVER

BACKGROUND OF THE INVENTION

1. Field of the Invention

The present invention relates generally to wireless devices that filter between multiple supported bands of operation, and more particularly relates to a cellular telephone that discriminately adjusts filtering levels to reduce insertion loss.

2. Background of the Invention

Manufacturers of wireless communication devices continuously strive to offer increasing functionality and features in their products. These advances are intended to lead to great convenience to the users and increased market share to the manufacture. As is often the case, combining features and functions on a single device requires coordination between the features and functions and frequent compromises between attributes, such as, speed, power, bandwidth, size, performance, and others.

The most basic function of a wireless communication device is, obviously, communicating with others. For standard wireless communication, a transmitter modulates data onto a radio frequency (RF) carrier signal and transmits the signal to a receiver. Conversely, a receiver in the wireless device receives RF signals and demodulates to determine and capture the data riding on the signal. Various transmission schemes are available and widely used. Some of these schemes include Code Division Multiple Access (CDMA), Time Division Multiple Access (TDMA), or other wireless communication systems. A CDMA system may implement one or more CDMA standards such as IS-95, IS-2000 (also commonly known as "1x"), IS-856 (also commonly known as "1xEV-DO"), Wideband-CDMA (W-CDMA), and others. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2. These standards are known to those of skill in the art.

One feature, in addition to cellular communication, that is now available on a select number of wireless devices is communication with satellites that belong to the well-known Global Position System (GPS). GPS communication can be used for a variety of purposes, but mainly for determining terrestrial position of the receiver. For instance, by calculating the length of time a signal takes to travel from the satellite to the wireless device, the device's distance from the satellite can be calculated. By using multiple satellites, a device's three-dimensional position on the earth can be determined with considerable accuracy. To utilize the GPS, the wireless device uses a separate GPS antenna designed to communicate in the GPS frequency range.

Table 1 shows the various frequency bands in which a wireless communication device may operate, although the devices are not limited to these example frequencies and the bands are not limited to the frequency ranges shown.

TABLE 1

| Frequency Band | Frequency Range |
| --- | --- |
| Personal Communication System (PCS) | 1850 to 1990 MHz |
| Cellular | 824 to 894 MHz |
| Digital Cellular System (DCS) | 1710 to 1880 MHz |
| GSM900 | 890 to 960 MHz |
| International Mobile Telecommunications- 2000 (IMT-2000) | 1920 to 2170 MHz |
| CDMA450 | 411 to 493 MHz |
| JCDMA | 832 to 925 MHz |
| KPCS | 1750 to 1870 MHz |
| GPS | 1574.4 to 1576.4 MHz |

For each of the frequency bands listed in Table 1 (except for GPS), one frequency range is used for the forward link (i.e., downlink) from a base stations to a mobile wireless device, and another frequency range is used for the reverse link (i.e., uplink) from the mobile wireless device to the base stations. For example, for the cellular band, the 824 to 849 MHz range is used for the reverse link, and the 869 to 894 MHz range is used for the forward link.

Due to the need to support the multiple frequency bands of operation, it is necessary to separate RF energy between the bands. The separation prevents unintentional interference of signals transmitted in a first frequency band with signals being received in one or more other frequency bands. However, to stringently separate the bands, a large amount of attenuation at the unwanted frequencies is required. The consequence of this high attenuation is a higher insertion loss in the pass band, thus degrading the sensitivity of the receiver.

A GPS receiver that has to co-exist in a multi-mode phone will have inferior performance to a "stand alone" GPS receiver due to the above-described isolation requirements and the resulting insertion losses. This holds true even when there is no RF energy present at the undesired frequencies. This is particularly undesirable when the wireless device is acquiring a satellite. Typically, the tracking performance of a GPS receiver can withstand a higher noise figure when compared to acquisition; however, with the filtering components always in the signal path, all GPS signals are attenuated.

Therefore a need exists to overcome the problems with the prior art as discussed above.

SUMMARY OF THE INVENTION

Briefly, in accordance with the present invention, disclosed is an electrical circuit arrangement for reducing insertion loss in a GPS receiver. The circuit arrangement includes a first switch for diverting signals between a first pathway and a second pathway. A filter for attenuating signals having a certain frequency is in the first pathway. An amplifier is coupled to the first pathway downstream from the filter and is coupled to the second pathway. The circuit also includes an automatic gain controller with an input coupled to an output of the amplifier and an output coupled to a gain adjustment of the amplifier. The automatic gain controller senses a noise level in the output of the amplifier and adjusts a gain of the amplifier in response to the noise level. Additionally, the circuit includes a threshold detector with an input coupled to the output of the automatic gain controller and an output coupled to the first switch. The threshold detector causes the first switch to select between the first pathway and the second pathway.

In one embodiment of the present invention, the electrical circuit arrangement also includes a second switch coupled to an output of the filter and the second pathway and is controlled by the output of the threshold detector. The second switch diverts signals from the first pathway or the second pathway to the amplifier.

In an embodiment of the present invention, the second pathway has lower insertion losses than the first pathway.

In one embodiment of the present invention, upon determining a high noise level at the output of the amplifier, the automatic gain controller causes the threshold detector to cause the first switch to divert the signals through the filter. Alternatively, upon determining a low noise level at the output of the amplifier, the automatic gain controller causes the threshold detector to cause the first switch to divert the signals through the second pathway.

In yet another embodiment of the present invention, the electrical circuit arrangement includes a low-loss filter in the second pathway, the low-loss filter has a lower insertion loss than the filter.

The present invention also includes a method on a receiver for GPS signals. The method is for reducing insertion loss in the receiver and includes the steps of: receiving a signal with a wireless receiver; amplifying the signal; determining a noise level on the signal; and selecting a signal path to divert signals through one of a first pathway that includes a filter and a second pathway, the selection based on the noise level.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Figure 1:
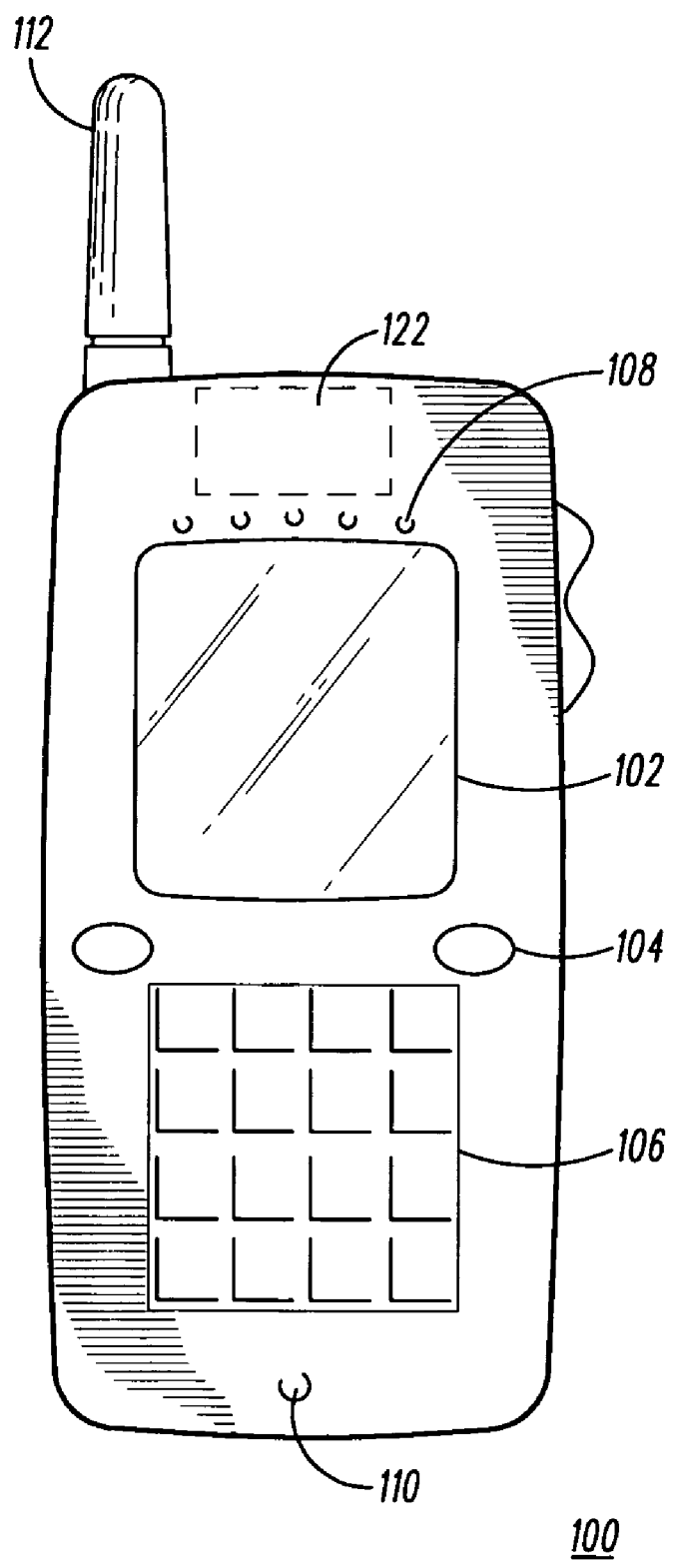
FIG. 1 is top-view diagram illustrating one embodiment of a wireless device in accordance with the present invention.

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The present invention, according to an embodiment, overcomes problems with the prior art by providing a GPS receiver that dynamically determines whether a pre-selector is necessary and switches the pre-selector in and out of the circuit in accordance with this determination.

Described now is an exemplary hardware platform according to an exemplary embodiment of the present invention.

Wireless Device

Referring now to FIG. 1, an exemplary wireless device 100 is shown. The specific wireless device 100 depicted in FIG. 1 is a cellular telephone. The present invention, however, is not so limited and can also be other wireless devices that are capable of wirelessly receiving signals in the GPS range, as well as at least one other frequency range. Other such devices may include, but are not limited to, PDA's, SmartPhones, Laptops, Pagers, Two-way Radios, satellite phones, and other communication devices.

In one embodiment of the present invention, the wireless device 100 is capable of transmitting and/or receiving radio frequency signals over a communication channel under a communications protocol such as CDMA, FDMA, TDMA, GPRS, and GSM or the like, as well as GPS. For clarity and ease of discussion a wireless telephone, its structures, and functions will be referred to throughout the remainder of the specification.

A wireless device 100 includes a display 102 for viewing information and commands, command buttons 104 for controlling modes and commands of the device, buttons 106 for entering information and dialing numbers, a speaker 108 for broadcasting voice and messaging information and audible alerts, and a microphone 110 for capturing and converting audible sounds to proportionate voltages.

The telephone 100 also includes a cellular communications antenna 112 for wirelessly communicating with a remote sender or receiver (not shown) via a signal path and a GPS antenna 122 for receiving signals from one or more satellites orbiting above the earth's surface.

The Global Positioning System (GPS) is actually a constellation of 27 Earth-orbiting satellites (24 in operation and three extras in case one fails). Originally, the GPS satellite network was developed and implemented by the U.S. military as a military navigation system. Today, however, it is opened to the public. Each of the 3,000 to 4,000-pound solar-powered satellites circles the globe at about 12,000 miles (19,300 km), making two complete rotations every day. The orbits are arranged so that at any time, anywhere on Earth, there are at least four satellites "visible" in the sky. On Earth, a GPS receiver is used to locate four or more of these satellites by receiving signals from each. The distance to each satellite is determined by knowing when each signal is sent and that radio waves travel at the speed of light (about 186,000 miles per second, 300,000 km per second in a vacuum). The GPS receiver can determine how far the signal has traveled by timing how long it took the signal to arrive and then using the determined distances to determine its own location, using a known mathematical principal called "trilateration."

Figure 2:
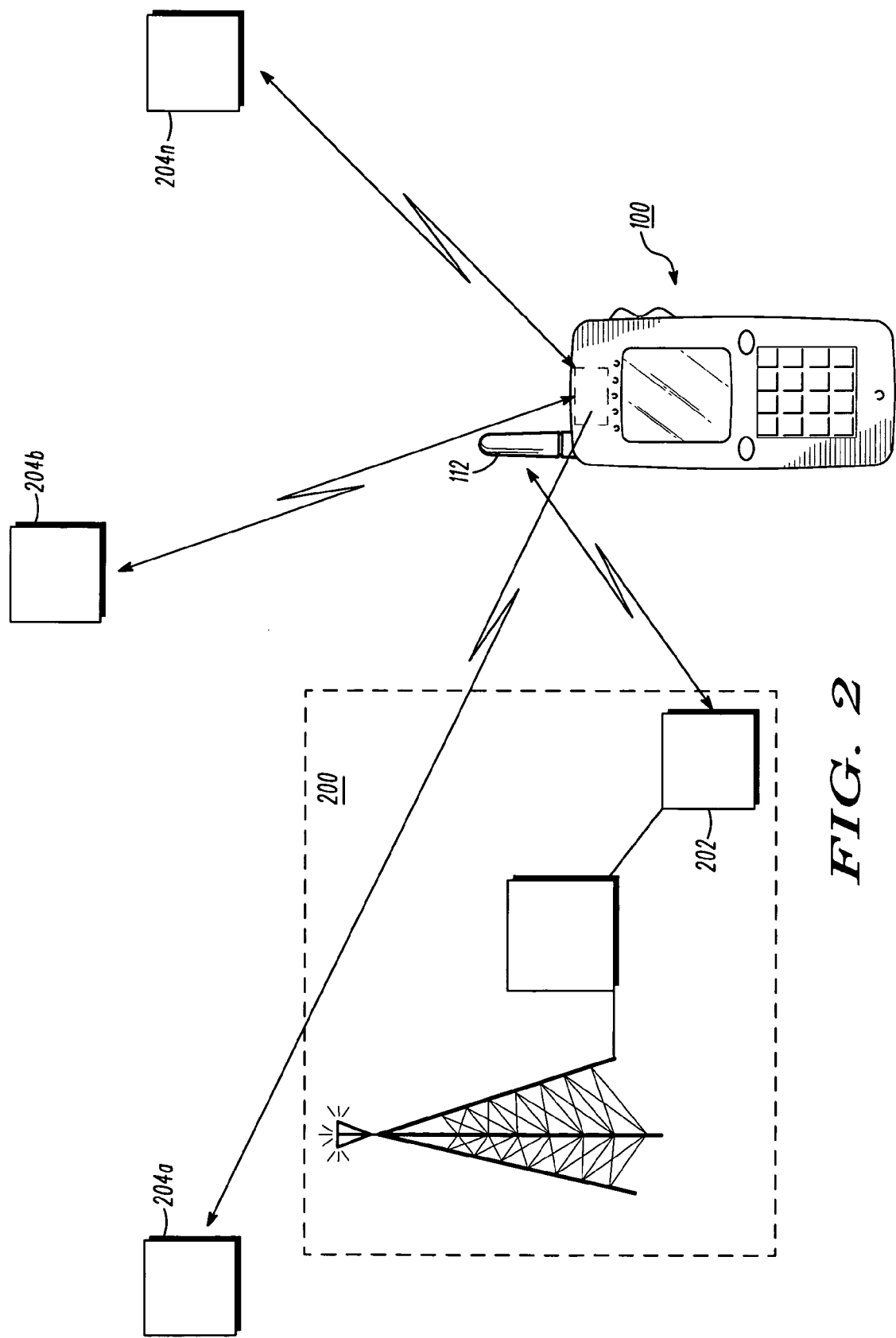
FIG. 2 is an overall system diagram illustrating one embodiment of a mobile communication network in accordance with the present invention.

Referring now to FIG. 2, the wireless device 100 is shown interfacing via the cellular communication antenna 112 with the provider equipment 200 via a wireless communication link established with base stations 202. The wireless device 100, according the present example, works in conjunction with the provider equipment 200 to provide a user with services such as telephone interconnect, short message service, dispatch or instant conferencing, circuit data, packet data, combinations thereof, as well as other data services. The wireless device 100 is also shown interacting with a plurality of orbiting satellites 204a-n via the GPS antenna 122.

Figure 3:
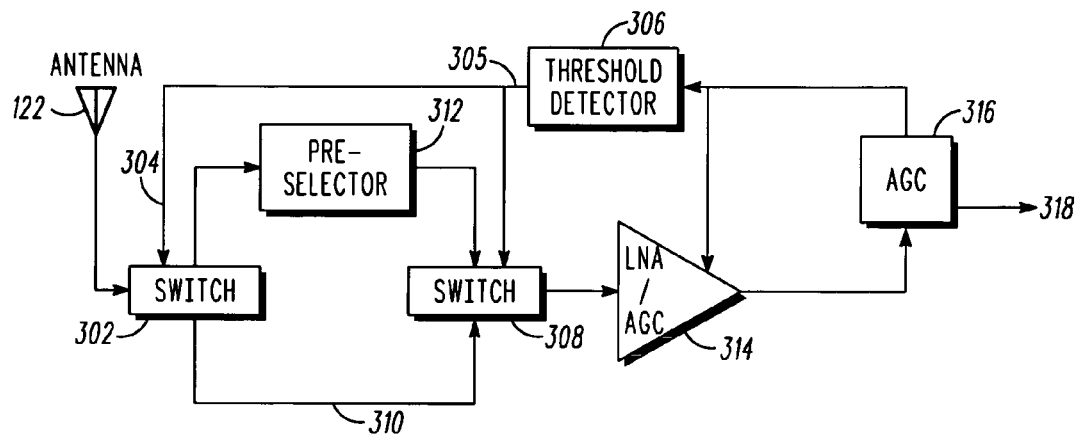
FIG. 3 is a hardware block diagram illustrating one embodiment of a wireless device in accordance with the present invention.

Referring now to FIG. 3, a block diagram of an electronic circuit 300 internal to the wireless device 100 is shown. The circuit 300 is an example of one embodiment of a receiver in accordance with the present invention and is provided between the GPS antenna 122 and other internal circuitry within the wireless device 100. The circuit 300 is operable to determine whether undesired frequencies should be suppressed. A pre-selector is then switched in and out of the current path based on the determination.

GPS and other airborne signals are input to the circuit 300 through GPS antenna 122. Ideally, only signals in the GPS range of 1574.4 to 1576.4 MHz would be received by the GPS antenna, and even though the physical shape and size of the antenna element does attenuate most signals that are not within this frequency band, undesired signals and noise that exists in the air will unavoidably be received by the GPS antenna 122. The signals received by the antenna 122 travel to a first switch 302. The first switch 302 has a first position and a second position and is selectable by an input 304 that is an output of a threshold detector 306 that will be explained below. The first position of the first switch 302 creates a current path from the antenna 122 to a second switch 308 along a signal line 310. Signal line 310 is shown in FIG. 3 as a short circuit from the first switch 302 to the second switch 308, but can include other elements in the path. Alternately, when the first switch 302 is in a second position, a current path is created from the GPS antenna 122 to a pre-selector 312.

The pre-selector 312 in FIG. 3 represents any known filtering block. The pre-selector type depends on the application and the frequencies or frequency bands being blocked and/or passed. For example, the pre-selector 312 can be a high-pass filter, a low-pass filter, a band-pass filter, a band-stop filter, a notch filter, and others. Filters are known in the art and consist of inductive, capacitive, and even resistive elements, depending on the particular type of filter. The meanings of 'low' and 'high'—i.e. the cutoff frequency—depend on the characteristics of the filter. (The term "low-pass filter" merely refers to the shape of the filter's response. A high-pass filter could be built that cuts off at a lower frequency than any low-pass filter. It is their responses that set them apart.)

Figure 6:
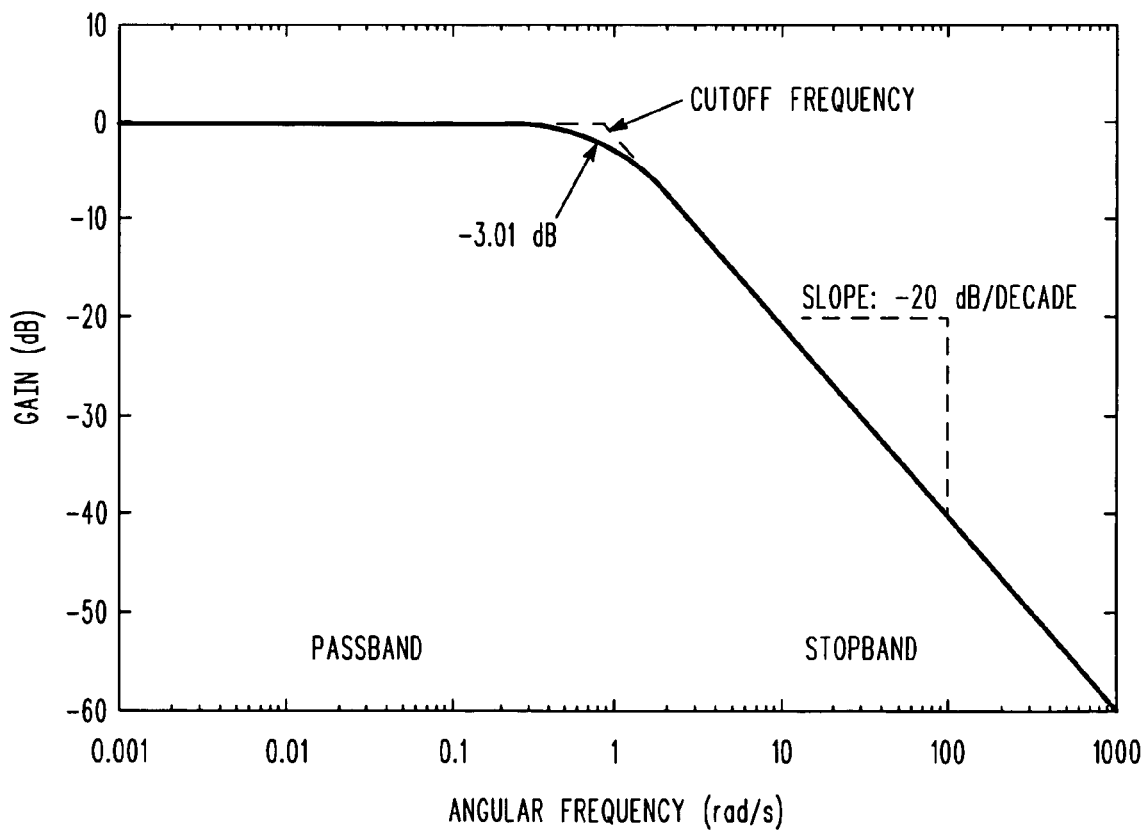
FIG. 6 is a plot of the frequency response of a filter for attenuating higher frequencies in accordance with an embodiment of the present invention.

Insertion loss, measured in dB, is the ratio between the power received at a specified load before and after the insertion of the filter at a given frequency, and is calculated mathematically by the equation: Insertion Loss (dB)=10 log (Pout/Pin). This measurement is an indication of the degree of attenuation provided by the filter at that frequency. Generally speaking, the better the filter, the higher the attenuation. A first-order filter, for example, will reduce the signal strength by half (about −6 dB) every time the frequency doubles (goes up one octave). The magnitude Bode plot for a first-order filter is shown in FIG. 6 and looks like a horizontal line below the cutoff frequency, and a diagonal line above the cutoff frequency. There is also a "knee curve" at the boundary between the two, which smoothly transitions between the two straight line regions.

A second-order filter does a better job of attenuating higher frequencies. A Bode plot for this type of filter is shown in FIG. 6 and resembles that of a first-order filter, except that it falls off more quickly. For example, a second-order Butterworth filter (which is a critically damped RLC circuit, with no peaking) will reduce the signal strength to one fourth its original level every time the frequency doubles (−12 dB per octave). Other second order filters may roll off at different rates initially depending on their Q factor, but approach the same final rate of −12 dB per octave.

Third and higher order filters are defined similarly. In general, the final rate of roll-off for an n-order filter is 6n dB per octave. Although filter performance increases with increasing order, so too do the losses at the pass-through frequencies, resulting in unwanted degradation in performance of the GPS receiver. Therefore, increased performance can be realized if any filtering circuits are avoided or if the order of a filtering circuit used can be reduced. Thus, when feasible, path 310 will be used by the receiver circuit 300.

Referring back to FIG. 3, the output of the pre-selector 312 is input to the second switch 308, which, like the first switch 302, is controlled by an output 305 of the threshold detector 306. The second switch 308 channels the signal downstream in the circuit 300 and prevents it from returning back to the first switch 302 via the low resistance/impedance signal path 310.

After leaving the second switch 308, whether the signal comes from the pre-selector 312 or the straight from the first switch 302 along the signal path 310, it is input to a Low Noise Amplifier (LNA) 314. An LNA is a special type of electronic amplifier used in communication systems to amplify very weak signals captured by an antenna. It is a key component, which is usually placed at the front-end of a receiver system. Using a LNA, the noise of all the subsequent stages is reduced by the gain of the LNA and the noise of the LNA is injected directly into the received signal. Thus, it is desirable for a LNA to boost the signal power while adding as little noise and distortion as possible so that the retrieval of this signal is possible in the later stages in the system. In the exemplary circuit of FIG. 3, the LNA 314 outputs the boosted signal to an Automatic Gain Control (AGC) circuit 316.

Automatic gain control (AGC) is found in many types of devices and its purpose is to control the gain of a system in order to maintain some measure of performance over a changing range of real world conditions. However, the strength of the signal received will vary widely, depending on the range to the transmitter, signal path attenuation, and so on. The AGC measures the RF energy on the output of the LNA 314 and automatically adjusts the gain of the LNA 314. When a level of RF energy that is high enough to be detrimental to performance is received by the AGC 316, the gain of the LNA 314 is increased to boost the GPS data signal. Conversely, when detrimental RF energy is at a low level on the output signal line of the LNA 314, the AGC 316 reduces or keeps constant the gain of the LNA 314. The AGC 316 does not, however, have to be connected to the LNA 314. It can be provided in a non-RF path, such as the back end of the circuit.

The output of the AGC 316 is fed directly to the threshold detector (TD) 306 as well as to a second stage 318 within the receiver. A TD is an electronic circuit that can include an operational amplifier and is often used in conjunction with other circuit elements. The TD 306 functions as a simple voltage switch. The output of the TD depends on a voltage level present on an input line. For instance, in one embodiment of the present invention, when the output of the AGC 316 is below a specified voltage level, the TD 306 outputs a positive voltage and when the output of the AGC 316 is above a specified voltage level, the TD 306 outputs a negative voltage. As stated above, the output of the TD 306 is fed to the first switch 302 and the second switch 308. The changing state of the TD 306 each time the AGC 316 crosses a threshold voltage level causes the first switch 302 and the second switch 308 to change state, thereby affecting the current path between the switches.

It should be noted here that the functionality of the TD 306 is not limited to that described above. In embodiments of the present invention, the threshold voltage is set at zero, negative voltages, and an upper voltage level that varies, or is different from, the lower voltage level.

The operation of the circuit 300 shall now be described. An airborne signal is captured by the antenna 122 and fed to the first switch 302. For this discussion, it is assumed that the first switch 302 is positioned so as to divert the signal through the short circuit signal path 310. By taking signal path 310, no filtering elements are in the path, thereby reducing insertion losses. The signal passes through the second switch 308 to the LNA 314, where the signal is amplified and output to the AGC 316 and then to a second stage 318. As mentioned previously, an AGC 316 samples the output signal line of the LNA 314 and outputs a signal proportional to the amount of detrimental RF energy existing on the line. The AGC 316, therefore, determines the amount of noise on the signal line output from the LNA 314. If the noise is high, the AGC 316 will cause the TD 306 to switch the signal path between the first and second switches 302, 308 to the path through the pre-selector 312. The pre-selector, in this example, is a band pass filter that allows frequencies within the GPS band (1574.4 to 1576.4 MHz) to pass and attenuates all other frequencies. In practice however, the filter is not able to attenuate frequencies outside the GPS band without also affecting the frequencies within the GPS band. The now filtered signal leaves the pre-selector 312 and is input to the LNA 314. Since only the GPS frequency band is now received by the LNA 314, less noise will be sampled by the AGC 316.

In this manner, the receiver decides if the pre-selector function of the receiver is necessary. If there is no need to suppress undesired frequencies, then the receiver will switch out the pre-selector. This is particularly useful during the period of satellite acquisition. During this acquisition process, the GPS receiver can improve its noise figure by not using the pre-selector if it is not needed. There is a great benefit to the performance of the GPS receiver if the noise figure is lowered during the acquisition stage because typically, the tracking performance of the GPS receiver can withstand a higher noise figure when compared to acquisition.

In an off-network mode, where the wireless device is not communicating with a cellular or any other network, and the GPS receiver has acquired, or is attempting to acquire, one or more satellites, the device is considered to be in an "autonomous" mode. In this mode, the device's transceiver is off and the pre-selector will more than likely not be needed. If the pre-selector is switched out, the GPS receiver will have a better chance to acquire because the decoding of ephemeris will be faster since the noise figure is lower.

Figure 4:
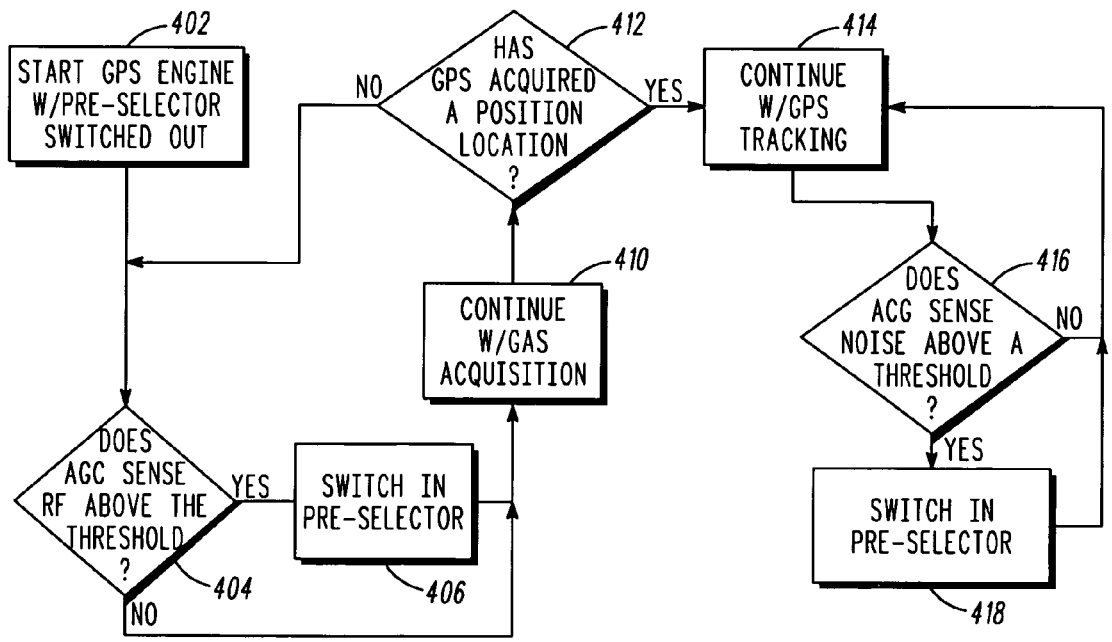
FIG. 4 is a flow diagram illustrating an exemplary operation of the wireless device of FIG. 2, in accordance with the present invention.

FIG. 4 is a flow diagram illustrating the process of the present invention. The process begins at step 402 where the first and second switches 302, 308 are positioned so that the pre-selector is switched out of the circuit. Next, in step 404, the AGC 316 tests the GPS input signal. If the AGC 316 senses RF energy above a predetermined threshold, the flow moves to step 406, where the pre-selector 312 is switched into the circuit 300. The flow then moves to step 410 where the wireless device 100 attempts to acquire the relevant GPS satellites. If, however, in step 404, the AGC 316 doesn't sense RF energy above the predetermined threshold, the flow moves directly to step 410 where the wireless device 100 attempts to acquire the relevant GPS satellites. In step 412 a check is performed to determine whether the device has acquired the relevant satellites. If the device 100 has fully acquired the satellites, the flow moves to step 414, where the device continues tracking the GPS system to determine the device's location. A continuous check is performed in step 416 to determine whether the noise level is above a predetermined noise threshold. If no noise is present and/or above the threshold, the flow moves back to step 414, where the device continues tracking the GPS system to determine the device's location. If noise is present and above the threshold, the flow moves from step 416 to step 418, where the pre-selector is switched in. The flow then moves back to step 414, where the device continues tracking the GPS system to determine the device's location. However, if in step 412 it is determined that the device 100 has not been able to acquire the relevant satellites, the flow moves back to step 404, where the AGC 316 again senses the RF energy on the signal line and continues as described above.

Figure 5:
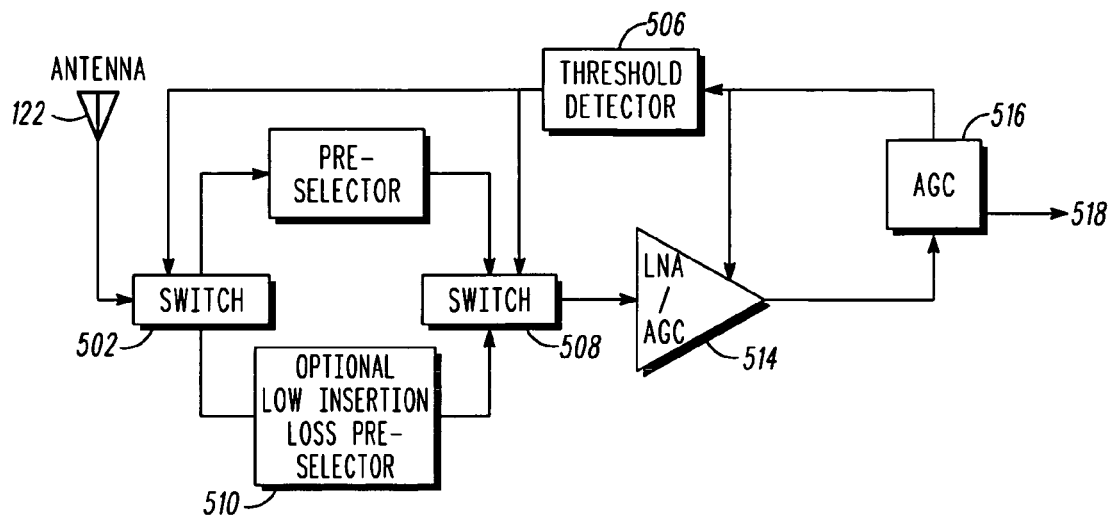
FIG. 5 is a hardware block diagram illustrating one embodiment of a wireless device in accordance with the present invention.

FIG. 5 shows another embodiment of the present invention, which is shown as the block schematic diagram of FIG. 3, where the short-circuit path 310 is replaced by a low-insertion-loss pre-selector (LILPS) 510 that provides lower out-of-band protection than the pre-selector, but also provides lower insertion losses.

With the circuit of FIG. 5, an airborne signal is captured by the antenna 122 and fed to the first switch 502. For this discussion, it is assumed that the first switch 502 is positioned so as to divert the signal through the LILPS 510. The signal passes through the second switch 508 to the LNA 514, where the signal is amplified and output to an AGC 516 and then to a second stage 518. As mentioned previously, an AGC 516 samples the output signal line of the LNA 514 and outputs a signal proportional to the amount of detrimental RF energy existing on the line. The AGC 516, therefore, determines the amount of noise on the signal line output from the LNA 514. If the noise is high, the AGC 516 will cause the TD 506 to switch the signal path between the first and second switches 502, 508 to the path through the pre-selector 512, which provides greater out-of-band protection than did the LILPS 510. The filtered signal leaves the pre-selector 512 and is input to the LNA 514. Since a more stringently-filtered signal is now received by the LNA 514, less noise will be sampled by the AGC 516.

The receiver decides if the pre-selector function of the receiver is necessary. If heavy suppression of undesired frequencies in unnecessary, the receiver will switch from the pre-selector 512 to the LILPS 510. This is particularly useful during the period of satellite acquisition. During this acquisition process, the GPS receiver can improve its noise figure by using the lower insertion loss LILPS 510 if the pre-selector 512 is not needed. There is a great benefit to the performance of the GPS receiver if the noise figure is lowered during the acquisition stage because typically, the tracking performance of the GPS receiver can withstand a higher noise figure when compared to acquisition.

Conclusion

The present invention can be realized in hardware, software, or a combination of hardware and software. Any kind of computer system—or other apparatus adapted for carrying out the methods described herein—is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer medium may include, for example, volatile storage such as RAM, buffers, cache memory, and network circuits. Furthermore, the computer readable medium may comprise computer readable information in a transitory state medium such as a network link and/or a network interface, including a wired network or a wireless network, that allow a computer to read such computer readable information.

The terms "a" or "an", as used herein, are defined as one, or more than one. The term "plurality", as used herein, is defined as two, or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The terms "program", "computer program", "software application", and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. An electrical circuit arrangement for reducing insertion loss in a GPS receiver, the circuit arrangement comprising:
    a first switch for diverting signals to one of at least a first pathway and a second pathway, each signal having a frequency;
    a filter in the first pathway, the filter for attenuating signals having a certain frequency;
    an amplifier coupled to the first pathway downstream from the filter and coupled to the second pathway;
    an automatic gain controller with an input coupled to an output of the amplifier and an output coupled to a gain adjustment of the amplifier, the automatic gain controller for sensing a noise level in the output of the amplifier and adjusting a gain of the amplifier in response to the noise level; and
    a threshold detector with an input coupled to the output of the automatic gain controller and an output coupled to the first switch for causing the first switch to select at least one of the first pathway and the second pathway.

2. The electrical circuit arrangement according to claim 1, further comprising:
    a second switch coupled to an output of the filter and the second pathway and controlled by the output of the threshold detector, the second switch for diverting signals from at least one of the first pathway and the second pathway to the amplifier.

3. The electrical circuit arrangement according to claim 1, wherein the second pathway has lower insertion losses than the first pathway.

4. The electrical circuit arrangement according to claim 1, wherein:
    upon determining a high noise level at the output of the amplifier, the automatic gain controller causes the threshold detector to cause the first switch to divert the signals through the filter and upon determining a low noise level at the output of the amplifier, the automatic gain controller causes the threshold detector to cause the first switch to divert the signals through the second pathway.

5. The electrical circuit arrangement according to claim 1, further comprising:
    a low-loss filter in the second pathway, the low-loss filter having a lower insertion loss than the filter.

6. The electrical circuit arrangement according to claim 1, wherein the filter attenuates frequencies below about 1574.4 MHz and above about 1576.4 MHz.

7. A method on a receiver for GPS signals, the method for reducing insertion loss in the receiver, the method comprising:
    receiving a signal with a wireless receiver;
    amplifying the signal;
    determining a noise level on the signal; and
    selecting a signal path to divert signals through one of a first pathway that includes a filter and a second pathway, the selection based on the noise level.

8. The method according to claim 7, wherein the determining is performed by an automatic gain controller.

9. The method according to claim 8, wherein the selecting is caused by an output signal of a threshold detector coupled to an output of the automatic gain controller.

10. The method according to claim 9, further comprising:
    determining with the threshold detector whether the output of the automatic gain controller is above a predetermined voltage level.

11. The method according to claim 7, wherein the determining step comprises:
    determining whether the noise level is above a predetermined noise level limit.

12. The method according to claim 7, wherein the second pathway includes a low-insertion-loss filter.

13. The method according to claim 7, further comprising:
    after the selecting step:
        determining a noise level on the signal; and
        selecting either the first pathway that includes the filter or the second pathway, the selection based on the noise level.

14. The method according to claim 7, further comprising:
    selecting the first pathway that includes the filter before performing the receiving step.

15. A computer readable medium for determining a signal path in a GPS receiver, the computer readable medium comprising:
    a volatile or non-volatile storage medium readable by a processing circuit and storing instructions for execution by the processing circuit for performing a method comprising:
        causing a receiver to receive a signal with a wireless receiver;
        determining a noise level on the signal; and selecting a signal path to divert signals through one of a first pathway that includes a filter and a second pathway, the selection based on the noise level.

16. The computer readable medium according to claim 15, further comprising:
causing an amplifier to amplify the signal before the determining step.

17. The computer readable medium according to claim 15, further comprising:
after the selecting step:
determining a noise level on the signal; and
selecting either the first pathway that includes the filter or the second pathway the selection based on the noise level.

18. The computer readable medium according to claim 15, wherein the second pathway includes a low-insertion-loss filter.

19. The computer readable medium according to claim 15, wherein the determining based on a signal received from an automatic gain controller.

20. The computer readable medium according to claim 19, wherein:
the determining is based on whether an output of the automatic gain controller is above a predetermined voltage level.

* * * * *